(12) United States Patent
Haddadi et al.

(10) Patent No.: US 10,488,679 B2
(45) Date of Patent: Nov. 26, 2019

(54) METHOD FOR FITTING A PREDETERMINED GLASSES FRAME FOR THE USE THEREOF BY A GIVEN WEARER

(71) Applicant: ESSILOR INTERNATIONAL (COMPAGNIE GENERALE D'OPTIQUE), Charenton-le-Pont (FR)

(72) Inventors: Ahmed Haddadi, Charenton-le-Pont (FR); Sarah Marie, Charenton-le-Pont (FR)

(73) Assignee: Essilor International, Charenton-le-Pont (FR)

( * ) Notice: Subject to any disclaimer, the term of this patent is extended or adjusted under 35 U.S.C. 154(b) by 0 days.

(21) Appl. No.: 15/108,632

(22) PCT Filed: Dec. 22, 2014

(86) PCT No.: PCT/FR2014/053505
§ 371 (c)(1),
(2) Date: Jul. 5, 2016

(87) PCT Pub. No.: WO2015/101738
PCT Pub. Date: Jul. 9, 2015

(65) Prior Publication Data
US 2016/0327811 A1 Nov. 10, 2016

(30) Foreign Application Priority Data

Jan. 2, 2014 (FR) .................................... 14 50017

(51) Int. Cl.
*G02C 13/00* (2006.01)
*G06F 17/50* (2006.01)

(52) U.S. Cl.
CPC ......... *G02C 13/003* (2013.01); *G02C 13/001* (2013.01); *G02C 13/005* (2013.01); *G06F 17/5009* (2013.01)

(58) Field of Classification Search
CPC .. G02C 13/003; G02C 13/005; G06F 17/5009
(Continued)

(56) References Cited

U.S. PATENT DOCUMENTS

| 4,762,407 A | 8/1988 | Anger et al. |
| 2003/0123026 A1 | 7/2003 | Abitbol et al. |
| 2017/0322430 A1 | 11/2017 | Fayolle et al. |

FOREIGN PATENT DOCUMENTS

| CN | 85105981 | 3/1986 |
| CN | 2566296 | 8/2003 |

(Continued)

OTHER PUBLICATIONS

International Search Report, dated Aug. 6, 2015, from corresponding PCT application.

(Continued)

*Primary Examiner* — Jack Dinh
(74) *Attorney, Agent, or Firm* — Young & Thompson (57) ABSTRACT

A method for fitting an actual predetermined glasses frame, selected by a given wearer, for use thereof by the wearer, includes the following steps: the head of the wearer is at least partially modelled, in at least one reference system, with at least one model of part of the nose and one model of part of the ears; simulating the positioning of the frame on the head of the wearer is carried out, in the model of the head of the wearer, by placing the corresponding areas of the frame, or a model of the latter, one over the other; and on the basis of placing these one over the other, the necessary change in shape of the actual predetermined frame is determined in order to achieve a fitting of the frame on the head of the wearer in accordance with at least one predetermined fitting criterion.

20 Claims, 4 Drawing Sheets

(58) Field of Classification Search
USPC .................................................. 351/204, 246
See application file for complete search history.

(56) References Cited

FOREIGN PATENT DOCUMENTS

| | | |
|---|---|---|
| CN | 2697682 | 5/2005 |
| CN | 106922182 | 7/2017 |
| EP | 1 011 006 A1 | 6/2000 |
| GB | 358 838 A | 10/1931 |
| WO | 01/79918 A1 | 10/2001 |
| WO | 01/88654 | 11/2001 |
| WO | 2013/149891 A1 | 10/2013 |

OTHER PUBLICATIONS

Chinese Office Action for Application No. 201480075419.1, dated Jul. 17, 2018, with English translation provided.

METHOD FOR FITTING A PREDETERMINED GLASSES FRAME FOR THE USE THEREOF BY A GIVEN WEARER

TECHNICAL FIELD TO WHICH THE INVENTION RELATES

The present invention relates to a method for adjusting a predetermined spectacle frame for its use by a given wearer.

TECHNOLOGICAL BACKGROUND

Conventionally, an optician performs an adjustment of the frame directly on the face of the wearer, manually, depending on indications of comfort that the wearer provides him with and know-how gained from experience.

This adjustment is long and tedious for the optician and the wearer, and its quality, which is important for the visual correction, depends on the operator and the care taken performing this operation.

It is often carried out on reception of the finished pair of spectacles, i.e. in which the ophthalmic lenses have been mounted.

Therefore, this process does not always allow a pair of spectacles to be produced the optical and mechanical characteristics of which are precisely adapted to the wearer.

A method for determining characteristics of a frame so that they are perfectly adapted to the face of the wearer is especially known from document U.S. Pat. No. 4,762,407, this method providing one possible solution to this problem.

In the method proposed by this document, the ideal placement in front of the eyes of the wearer of ophthalmic lenses providing the visual correction required by the wearer is firstly determined. Next, the geometric characteristics of the frame allowing this ideal placement of the ophthalmic lenses in front of the eyes of the wearer are determined depending on the shape of the face of the wearer. Lastly, the frame is constructed so as to have the determined geometric characteristics.

However, this method does not allow a predetermined frame, which has already been assembled, to be adjusted to fit on the face of a wearer in the absence or presence of ophthalmic lenses.

SUBJECT OF THE INVENTION

In order to remedy the aforementioned drawback of the prior art, the present invention proposes a method allowing a pre-existing real spectacle frame to be adjusted to fit on the face of the wearer.

More particularly, according to the invention a method is proposed for adjusting a predetermined real spectacle frame chosen by the wearer, for its use by this given wearer, and including the following steps:

b) determining an at least partial model of the head of the wearer, with, in a given frame of reference, at least one model of a portion of the nose, and one model of a portion of the ears, c) simulating the positioning of the frame on the head of the wearer, by superposing, on the model of the head of the wearer, the corresponding zones of said frame or of a model thereof, d) determining, from this superposition, the deformation of the predetermined real frame required to obtain a fit of this frame on the head of the wearer meeting at least one predetermined fitting criteria.

Thus, by virtue of the method according to the invention, it is possible to determine how a real spectacle frame chosen by the wearer and having a predetermined geometry needs to be deformed to adjust its fit on the head of the wearer so that this spectacle frame is correctly positioned on his face.

The expression "correctly positioned" is understood to mean the fact that the frame rests stably and comfortably on the face of the wearer.

Thus, the spectacle frame is considered to be correctly positioned on the face of the wearer when the following conditions are simultaneously met:

the rims of the frame are positioned with respect to the eyes of the wearer so as to offer the wearer the widest possible field of view, the spectacle frame rests on the nose of the wearer without sliding and without causing injury, with all the required stability, the frame temples of the spectacle frame rest on the ears of the wearer, without excessive compression of the temples and without pulling too much on the ears.

Once this required deformation has been determined, it is possible to apply it to the spectacle frame. This is preferably done before ophthalmic lenses are mounted in the frame.

It is envisioned here to only deform the real frame without adding material and while remaining within the limits of elastic deformation of the materials, so as to obtain the desired personalized frame without damaging it.

The deformation of the predetermined real frame is thus achievable without damage and/or without breaking this frame.

This method may at first be implemented before the ophthalmic lenses intended to be mounted in the frame have been manufactured.

The method then especially allows the frame to be adjusted to fit the face of the wearer in order to allow measurements of the wearer wearing the adjusted spectacle frame and that are required to manufacture the ophthalmic lenses to be taken The manufacture of the ophthalmic lenses is then more precise.

Once the ophthalmic lenses have been manufactured and mounted in the spectacle frame, it is possible that the weight of the ophthalmic lenses will deform the spectacle frame and that the latter will no longer have exactly the same adjusted geometry as before the mounting of the ophthalmic lenses. It is then possible to determine the deformation of the frame required to adjust the frame equipped with ophthalmic lenses to fit the face of the wearer. Readjustment of the frame is then spoken of.

More particularly, the following advantageous variants are envisioned:

in step b), the model of the head of the wearer is a numerical model, and, in step c), a numerical model of the frame is superposed on this numerical model of the head of the wearer by a numerical calculation;

in step b), the model of the head of the wearer is a physical model, and, in step c), a physical model of the frame is superposed on this physical model of the head of the wearer by actually placing the physical model of the spectacle frame on the physical model of the head of the wearer;

in step b), the model of the head of the wearer is a physical model, and, in step c), the frame itself is superposed on this physical model of the head of the wearer by actually placing the spectacle frame on the physical model of the head of the wearer.

The following are other nonlimiting and advantageous features of the method according to the invention:

prior to step c), a step a) is carried out of determining a model of the frame with, in another given frame of reference, at least one model of a portion of the bridge of the frame and one model of a portion of the frame temples of the frame;

in step c), the following are superposed: on the one hand, the model of one portion of the bridge of the frame and the model of one portion of the nose of the wearer, and on the other hand, the model of one portion of the frame temples of the frame and the model of one portion of the ears of the wearer;

in step b), the physical model of the head is produced to a scale of 1 using at least one of the following techniques:

rapid prototyping techniques,
a deformable bank that may optionally be motorized;

in step b), the physical model of the head is produced from a deformable carrier and an array of parts added to this carrier;

in step b), the physical model of the head is selected from a set of model heads produced beforehand;

in step d), said predetermined fitting criterion comprises a desired relative position of the frame temples of the frame with respect to the ears of the wearer;

in step d), said predetermined fitting criterion comprises a desired spacing of the frame temples of the frame, depending on a determined separation between the ears;

in step d), said predetermined fitting criterion consists of an optimization of the area of contact between two pads of the bridge of the frame and the nose of the wearer;

in step d), said predetermined fitting criterion comprises a desired inclination of the frame temples of the frame;

in step a), a model of a portion of the rims of the frame is moreover determined, in step b), a model of a portion of the eyes of the wearer is moreover determined and, in step d), said predetermined fitting criterion comprises a relative position of the rims of the frame and of the eyes of the wearer;

in step a), a model of a portion of the rims of the frame is moreover determined, in step b), a model of a portion of the cheekbones and/or eyebrows of the wearer is moreover determined and, in step d), said predetermined fitting criterion comprises a desired minimum distance between the rims of the frame and the cheekbones and/or eyebrows of the wearer;

in a step e), the user is given adjusting instructions allowing him to apply the deformation determined in step d) to the spectacle frame;

in a step f), the deformation determined in step d) is applied to the spectacle frame;

the following step is furthermore carried out:
g) the corrected relative position of the model of a portion of the rims of the frame and of the model of a portion of the eyes of the wearer is determined, while taking into account the required deformation of the frame determined in step d), by means of a numerical simulation analogous to that of step c).

the following step is furthermore carried out:
h) depending on said corrected relative position determined in step g), at least one geometrico-physiognomic parameter of implantation of an ophthalmic lens in the frame is determined so that the optical center of the lens faces the corresponding eye of the wearer.

the following step is furthermore carried out:
i) depending on said corrected relative position determined in step g), at least one optical refraction characteristic of at least one ophthalmic lens to be mounted in this frame is determined;

step b) is carried out at a first site and step d) is carried out at a second site;

the first site is located in any place accessible to the wearer, either physically or over the Internet, and the second site is located at an opticians or in an optical laboratory;

following step d), at least one of the two following additional steps is carried out:
p) returning information on the compatibility between the deformability of the frame and the required deformation of the frame (10) determined in step d),
q) after the frame has been adjusted, returning information indicating an anticipated final relative position of the frame on the head of the wearer.

DETAILED DESCRIPTION OF ONE EXEMPLARY EMBODIMENT

The description which follows with regard to the appended drawings given by way of nonlimiting examples will clearly elucidate the essence of the invention and the manner in which it may be carried out.

The objective of the method that is the subject of the invention is to allow a frame to be precisely and easily adjusted to fit on the head of a wearer while minimizing the involvement of the optician and wearer.

This on the one hand makes it possible to limit the time spent by the optician adjusting frames, and on the other hand makes it possible to make the adjustment process less tedious for the wearer.

Furthermore, the aim of the method that is the subject of the invention is to allow a "remote" virtual adjustment, i.e. one not requiring the wearer and/or the real spectacle frame to be physically present, to be carried out by determining the deformation of the frame required to obtain a precise fit. This deformation may then be applied to the frame, either automatically by a machine, or manually by a qualified person who is not necessarily the optician, in the presence or absence of the wearer. A real adjustment of the frame is thus obtained.

It is a question here of a deformation without addition of material and while remaining within the limits of elastic deformation of the constituent materials of the frame.

FIGS. 1 to 4 show a predetermined real spectacle frame chosen by the wearer. In the illustrated example, the spectacle frame is of full-rimmed type, i.e. the frame 10 includes rims 11, 12 in which ophthalmic lenses may be mounted.

These two rims 11, 12 are rigidly connected by a nose bridge 13. Each rim 11, 12 is also connected to a frame temple 14, 15 conventionally hinged to the corresponding rim.

Below the frame temples will be considered to be fixed in their open position one relative to the other.

Figure 1:
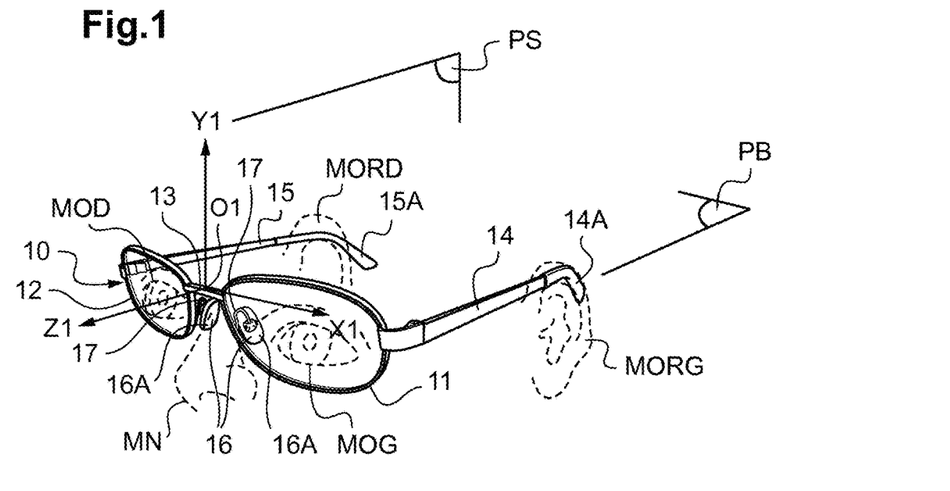
FIG. 1 is a schematic perspective view of a spectacle frame (solid lines) and a partial model of the head of the wearer (dashed lines)
Figure 2:
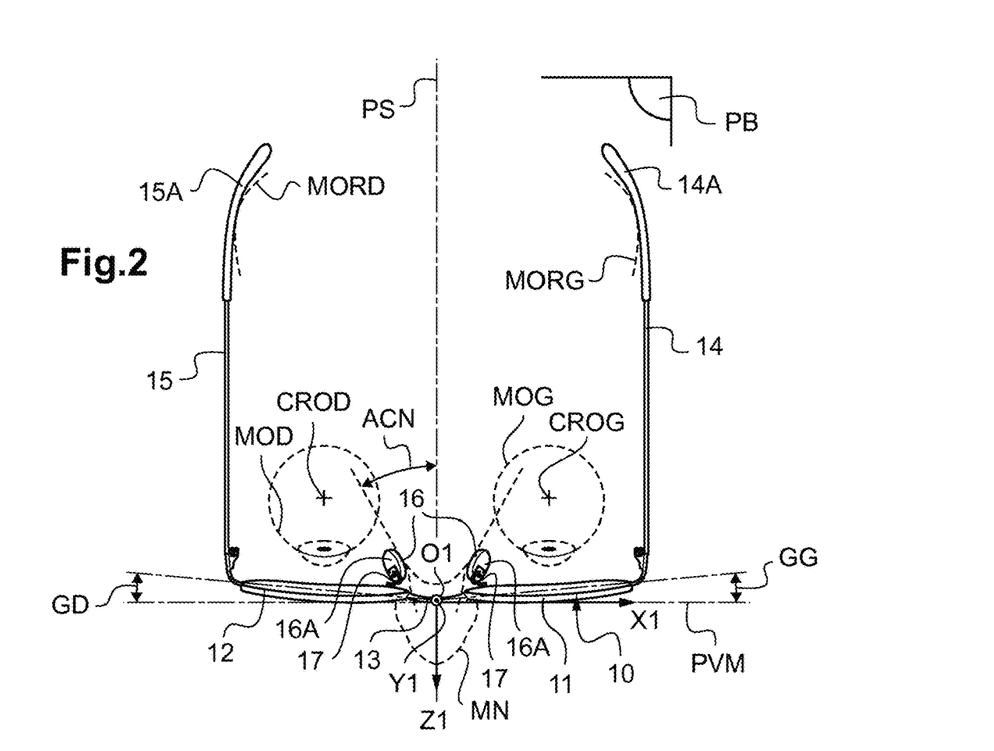
FIG. 2 is a schematic top view of the spectacle frame and the partial model of the head of FIG. 1.

The nose bridge 13 includes two surfaces 16 that rest on the sides of the nose of the wearer (FIG. 1). These rest surfaces 16 may be fixed, for example in the case of a frame made of plastic in which these surfaces are integrated into the rims of the frame, or be adjustable, for example in the case of a metal frame in which provision is made for two pads 16A each connected to the nose bridge by an arm 17 (FIGS. 1 and 2).

It is the latter case that is shown in the figures.

The pads 16A bearing the surfaces 16 of the frame 10 that rest on the nose of the wearer mainly have two adjustable parameters: on the one hand the distance of the pad 16A from the rim 11, 12 of the frame 10 and on the other hand the inclination of the pad 16A by a frontal angle and a splay angle, which will be defined below.

In the case described above of plastic frames, the position and inclination of the rest surfaces of the frame on the nose of the wearer are predetermined and fixed.

Each frame temple 14, 15 of the frame 10 comprises at least one first portion, the end of which is connected to the corresponding rim 11, 12. This first portion may be straight (FIG. 5) or have a slight curvature allowing it to closely follow the outline of the head TS of the wearer.

In the example shown in the figures, each frame temple 14, 15 of the frame 10 furthermore includes a second portion taking the form of a spatula 14A, 15A extending the first portion of the frame temple 14, 15 at the end opposite the rims 11, 12 of the frame 10.

This spatula 14A, 15A forms the curved end of the corresponding frame temple 14, 15. It is intended to be placed behind the corresponding ear ORD, ORG of the wearer (see FIG. 6).

As a variant, the frame temples of the frame do not include spatulas. In this case, it is the free end of the first portion of the frame temple that rests on the ear of the wearer. This variant is shown dashed in FIG. 6.

As another variant, the spectacle frame may be of drilled type, i.e. the lenses are drilled and each held by one end of the nose bridge and one end of the frame temple associated with the lens, which interact with drilled holes. This type of frame is similar to that described above, except that it does not include rims. The nose bridge and the frame temples are similar. In this case, the adjusting method described below takes into account the outlines of the ophthalmic lenses intended to be mounted in the frame instead of the outlines of the rims of the frame.

Generally, on leaving the factory new frames have a plane of symmetry PS passing through the middle of the nose bridge 13 and equidistant from the frame temples 14, 15 of the frame 10.

Furthermore, the first portion of the two frame temples 14, 15 initially extends in the same mean plane PB.

As shown in FIGS. 1 and 2, a first frame of reference associated with the frame 10, i.e. a frame of reference in which the frame 10 has a fixed orientation and position, is defined, this frame of reference having an orthonormal coordinate system (O1, X1, Y1, Z1). The center O1 of the coordinate system of this first frame of reference is, for example, the middle of the nose bridge 13. The axis O1Z1 is parallel to the intersection of the plane of symmetry PS of the frame 10 and of the mean plane PB of the frame temples 14, 15. The axis O1Y1 extends in the plane of symmetry PS of the frame 10, in the opposite direction to the rims of the frame. The axis O1X1 extends parallelly to the mean plane of the frame temples PB. The plane O1Y1Z1 thus corresponds to the plane of symmetry PS of the frame 10. The plane O1X1Z1 is parallel to the mean plane of the frame temples PB. The plane O1X1Y1 is called the vertical frame plane PVM.

Figure 3:
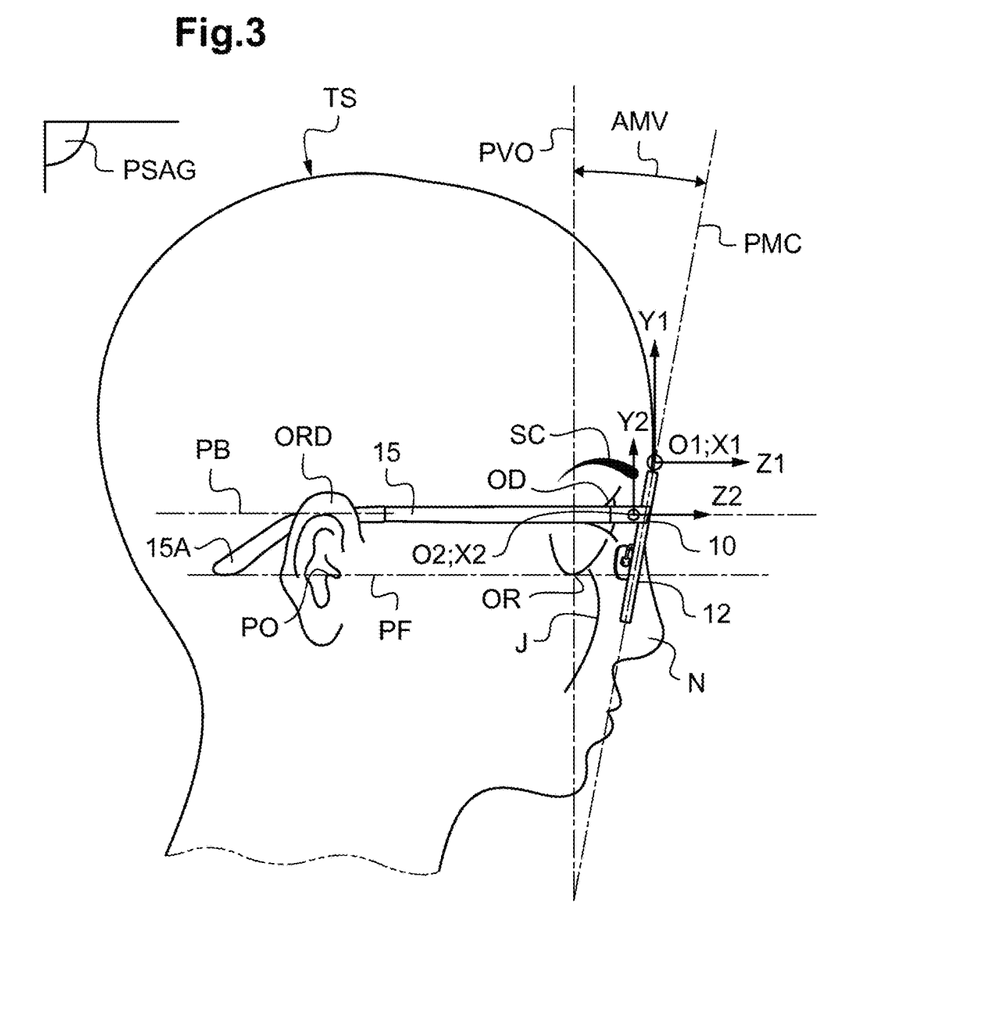
FIG. 3 is a schematic profile view of the head of the wearer with the spectacle frame.
Figure 4:
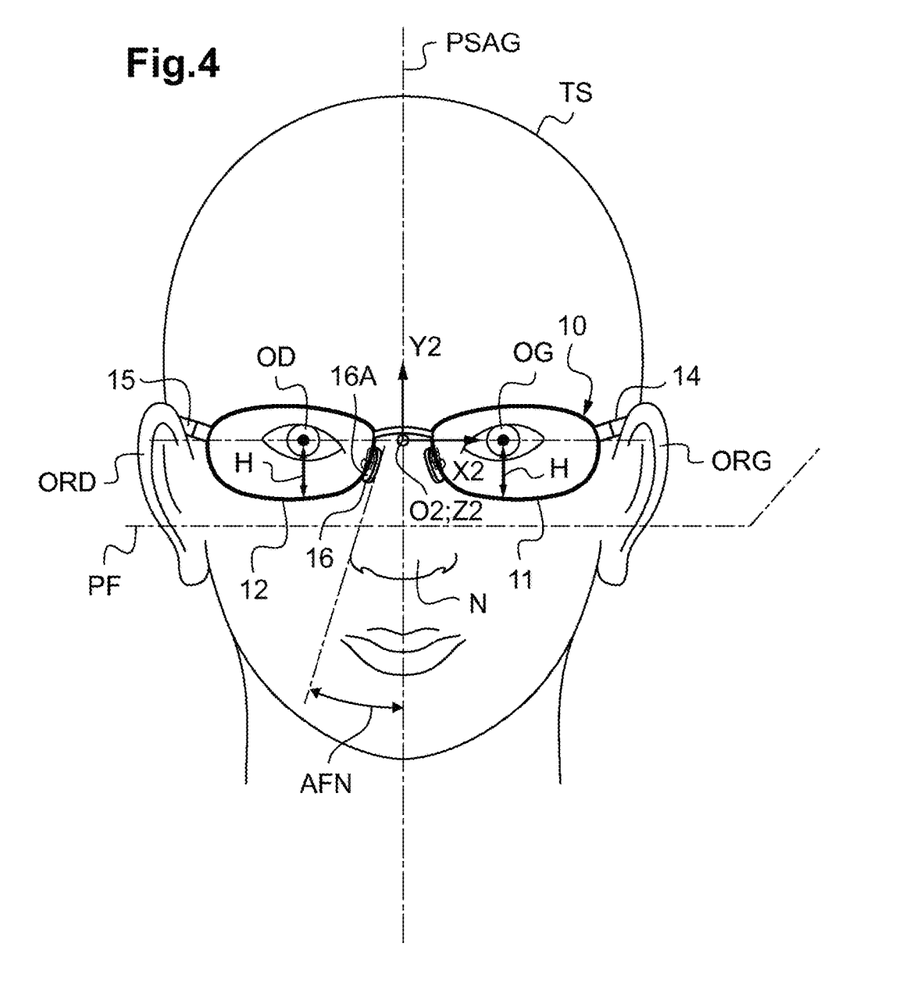
FIG. 4 is a schematic front view of the head of the wearer and of the spectacle frame of FIG. 3, FIGS. 5 and 6 illustrate a correct adjustment of a frame temple of the spectacle frame on the ear of the wearer.

As shown in FIG. 3, a second frame of reference associated with the head TS of the wearer, i.e. in which the head TS of the wearer has a fixed orientation and position, is defined, this frame of reference having an orthonormal coordinate system (O2, X2, Y2, Z2).

The Frankfurt plane PF of the head TS of the wearer is defined as the plane passing through the lower orbital points OR and the porion PO of the wearer, the porion being the highest point in the skull of the auditory canal, which corresponds to the tragion of the ear.

The wearer is considered to be in an orthostatic position, in which position he makes a minimum of effort. The gaze axis of the wearer is the primary gaze axis, i.e. he gazes straight ahead. The Frankfurt plane PF is then horizontal.

A sagittal plane PSAG of the head TS of the wearer is defined as being the vertical plane passing through the perpendicular bisector AO of the two eyes OG, OD. The perpendicular bisector AO of the eyes is the axis passing through the middle of the segment defined by the rotation centers of the two eyes and parallel to the Frankfurt plane PF.

The center O2 of the coordinate system of this second frame of reference is, for example, the middle of the segment connecting the rotation centers of the eyes OD, OG of the wearer.

The axis O2Z2 is located in the sagittal plane PSAG of the head TS of the wearer and is parallel to the Frankfurt plane PF. It extends in a direction away from the head of the wearer. The axis O2Y2 extends in the sagittal plane PSAG of the head TS of the wearer and is perpendicular to the Frankfurt plane PF. The axis O2X2 extends parallelly to the Frankfurt plane PF. As a variant, any other frame of reference of the frame and/or head of the wearer may be envisioned.

In the example described here, the adjusting method is first implemented before the ophthalmic lenses intended to be mounted in the frame have been manufactured.

The frame 10 may then comprise dummy demonstration lenses or no lenses.

According to the method for adjusting a predetermined real spectacle frame 10 according to the invention, the following steps are carried out:

b) determining an at least partial model of the head TS of the wearer, with, in a given frame of reference, at least one model MN of a portion of the nose N, and one model MORD, MORG of a portion of the ears ORD, ORG, c) simulating the positioning of the real frame 10 on the head TS of the wearer, by superposing, on the model of the head TS of the wearer, the corresponding zones of said real frame 10 or of a model thereof, d) determining, from this superposition, the deformation of the frame 10 required to obtain a fit of the predetermined real frame 10 on the head TS of the wearer meeting at least one predetermined fitting criterion.

According to a first embodiment of the method according to invention, said method is implemented by computational and electronic means programmed for this purpose.

Thus, in step b), the model of the head of the wearer is a numerical model, and, in step c), a numerical model of the frame is superposed on this numerical model on the head TS of the wearer by a numerical calculation.

Next, preferably, in a first step a) of the method according to the invention, an at least partial model of the frame 10 is determined, with, in said first frame of reference (O1, X1, Y1, Z1), at least one model of one portion of the bridge 13 of the frame 10 and one model of a portion of the frame temples 14, 15 of the frame 10.

Furthermore, a model of a portion of the rims 11, 12 of the frame 10 is preferably determined.

This model of the frame 10 (not shown in the figures) may for example consist of a set of measurements of characteristic lengths and angles of the frame.

These measurements for example include, for the model of a portion of the frame temples: the length of the first portion of the frame temples 14, 15, the length of the spatulas 14A, 15A, the separation between the frame temples 14, 15, the angle between the spatula 14A, 15A and the first portion of the corresponding frame temple 14, 15 in the plane O1Y1Z1 and in the plane O1X1Z1.

They for example include, for the model of a portion of the bridge: the separation between the rest surfaces 16 of the bridge 13 on the nose, the angle made between the rest surfaces 16 and the distance of these rest surfaces to the rims of the frame 10. They for example include, for the model of the rims 11, 12: the diameter of each rim 11, 12 in the plane O1,X1,Z1, the measurement of the face-form angle GD, GG corresponding to the angle made between each rim 11, 12 and the plane O1X1Y1 or vertical frame plane PVM (FIG. 2), and the position of the highest and lowest points of the rims 11, 12 in the plane O1Y1Z1. From these measurements of lengths and angles, it is possible to construct a model of the frame 10. This construction may take into account other parameters, such as the material of the frame or the thickness of the frame temples and rims.

The model of the frame 10 (not shown in the figures) may also consist of the positions in the first frame of reference (O1, X1, Y1, Z1) of a certain number of particular points of the frame 10. This model may lastly be the result of an acquisition of a three-dimensional image of the frame 10. This acquisition may for example be made using a stereoscopic image-acquiring device or using a three-dimensional scanner. Whatever the method for obtaining the model of the frame 10, the latter is stored in memory in the aforementioned electronic and computational means. It is thus possible to create, in this memory, a database including the models of a set of available spectacle frames, which are determined in advance.

In a second step b) of the method according to invention, an at least partial model of the head TS of the wearer is determined, with, in said second frame of reference (O2, X2, Y2, Z2), at least one model MN of a portion of the nose N, and one model MORD, MORG of a portion of the ears ORD, ORG.

Furthermore, preferably a model MOD, MOG of a portion of the eyes of the wearer is determined.

These models are schematically shown in FIGS. 1 and 2 by dashed lines.

The model MN of a portion of the nose for example preferably includes the width of the root of the nose N, the frontal angle AFN (FIG. 4) of the nose, the splay angle ACN of the nose (FIG. 2).

Figure 5:
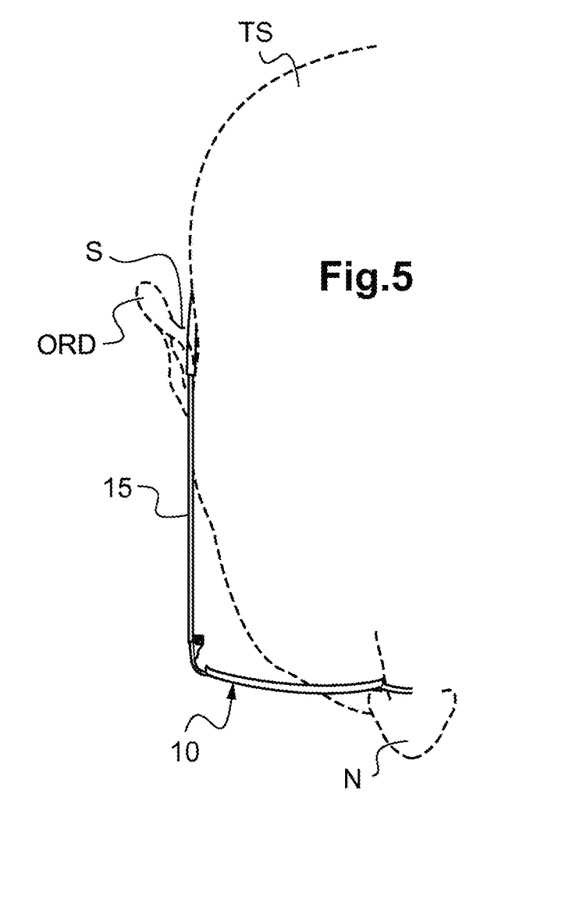
Figure 6:
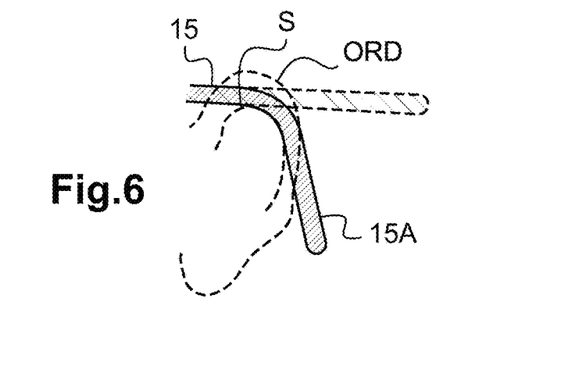

The model MORD, MORG of a portion of each ear of the wearer includes the coordinates of a curved surface corresponding to the trough S located between the auricle ORD, ORG and the skull of the wearer, behind the ear (FIGS. 5 and 6). Specifically, it is on this trough S that the corresponding frame temple 14, 15 of the spectacle frame 10 rests.

The model MOD, MOG of the eyes of the wearer for example includes the position in the second frame of reference (O2, X2, Y2, Z2) of the rotation center CROD, CROG of each eye. It may also comprise a diameter of the eye: the model of the eye then consists of a sphere of this diameter centered on the eye rotation center (FIG. 2). Preferably, a model of a portion of the cheekbones J and/or eyebrows SC (FIG. 3) of the head of the wearer is also determined. This model is preferably the result of an acquisition of a three-dimensional image of the head TS of the wearer. This acquisition may for example be made using a stereoscopic image-acquiring device or using a three-dimensional scanner.

Three-dimensional images of the head TS of the wearer, from in front (FIG. 4) and from the side (FIG. 3), and of the rim of the ears are preferably acquired. The acquisition preferably has an angular precision of 2 degrees and a distance precision of two millimeters.

It may be carried out by an external operator, for example by an optician in his shop. It is also possible to envision it being carried out remotely, for example by the wearer himself at home, and then transmitted to the operator responsible for adjusting the chosen frame.

The head of the wearer may also be modelled by capturing one or more two-dimensional images of the head of the wearer.

Whatever the 2D or 3D image-capturing device used, a piece of information indicating the scale of the captured image is recorded in correspondence with the captured images. It may be a question of the image of a scale indicator placed on the head of the wearer, for example an element including a pattern of known dimensions, placed on the head or on a spectacle frame of the wearer or of the known interpupillary distance of the wearer. This piece of information may also be delivered by the image-capturing device or received thereby.

This model of the head of the wearer is also stored in memory in the computational and electronic means.

The first and second steps a) and b) of the method according to the invention may be carried out in any order or even simultaneously.

In a third step c) of the method, the computational and electronic means simulate the position of the frame 10 on the head TS of the wearer by superposing, at least partially, on the one hand, the model of a portion of the bridge 13 of the frame 10 and the model of a portion of the nose N of the wearer, and, on the other hand, the model of a portion of the frame temples 14, 15 of the frame 10 and the model of a portion of the ears ORD, ORG of the wearer.

It is here a question of superposing by calculation the model of the frame 10 and the model of the head TS of the wearer.

The following example illustrates one possible way of numerically superposing two models.

Initially, the first and second frames of reference (O1, X1, Y1, Z1) and (O2, X2, Y2, Z2), of the frame and of the head, are considered to be coincident, then their relative position is optimized while maintaining the axis O1X1 parallel to the axis O2X2. The horizontality of the frame on the head of the wearer is thus ensured.

Thus, the first frame of reference (O1, X1, Y1, Z1) of the frame is moved translationally in the plane (O2, Y2, Z2), translationally along the axis O2X2 and rotationally about this axis O2X2 of the second frame of reference of the head.

The distances of translation of the first frame of reference (O1, X1, Y1, Z1) along O2Y2 and O2Z2 are called DY, DZ and the angle of rotation of the first frame of reference (O1, X1, Y1, Z1) of the frame about O2X2 is called DtetaX.

A function dependent on three parameters F(DY, DZ, DtetaX) is then defined, the value of which is minimal when the values DY, DZ, DtetaX optimally simulate the position of the model of the frame on the model of the head.

For example, the function F is minimal when the area of contact between the pads of the frame and the sides of the nose of the wearer is maximal, or when the distance between the pads of the frame and the sides of the nose is minimal, and when contact between the frame temples of the frame and the top of the trough S of the ears of the wearer is maximal, or when the distance between each frame temple of the frame and the trough S of the corresponding ear is minimal.

Thus, the function F may for example be written in the following form:

$$F(DY,DZ,DtetaX)=alpha1 \cdot F1(DY,DZ,DtetaX)+ alpha2 \cdot F2(DT,DZ,DtetaX),$$

where
the function F1 is a function exhibiting a minimum when the contact between the pads of the frame and the sides of the nose, and
the function F2 is a function exhibiting a minimum when the contact between the frame temples and the troughs of the ears is maximal,
alpha1 and alpha2 are positive weighting coefficients.

The functions Fi represent the various fitting criteria to be taken into account. These fitting criteria are detailed below.

In practice, the parameter DY is representative of a height of the position of the bridge of the frame on the nose, the parameter DZ is representative of a distance between the eyes and the rims of the frame, and the parameter DtetaX is representative of an angle of inclination of the frame temples of the frame with respect to the axis O2Z2 of the second frame of reference of the head of the wearer. It is also possible to optimize only the parameters DY, DZ by considering the frame temples of the frame to be parallel to the axis O2Z2 of the second frame of reference. A function F3 dependent on two parameters F3(DY,DZ) is then obtained. According to another variant, it is also possible to add additional positioning parameters, for example a distance of translation along the axis O2X2 of the second frame of reference of the head, distance referred to as DX, an angle DtetaY of rotation about the axis O2Y2, and/or an angle DtetaZ of rotation about the axis O2Z2 of this second frame of reference. This makes the optimization more complex but more precise.

In the example given above, the values of the parameters DY, DZ, DtetaX are determined by minimizing the function F using conventional optimization methods, for example the gradient descent method or the Levenberg-Marquardt method.

Other functions Fi (i>2) with weighting factors alphai may be introduced into the optimization function F, in order to allow the relative position of the model of the frame on the model of the head of the wearer to be determined with higher precision (for example functions allowing the weight of the frame and the coefficient of friction of the frame on the skin to be taken into account).

These weighting factors may also be determined depending on particular desires of the wearer. The latter may for example desire the frame to be positioned relatively high up or low down on his nose. Specifically, the frame is often positioned lower down on the nose in a reading position.

The weighting factors alpha1, alpha2, alphai allow the relative importance of the various functions in question to be taken into account.

It is for example possible to minimize certain weighting factors in order to allow the frame to be more easily adjusted.

At the end of the optimization, the model of the frame has thus been virtually positioned on the model of the head of the wearer, said position being representative of the position of the real frame 10 on the head TS of the wearer before deformation of the frame. The position is therefore not perfect and may still differ from the desired ideal position.

Once the optimal relative position of the model of the frame in the its initial geometry has been determined, the deformation of the frame 10 required to obtain a fit of the frame 10 on the head TS of the wearer meeting at least one predetermined fitting criterion is determined, from this superposition, in a step d).

It is a question of determining the deformation of the frame 10 required to achieve a satisfactory fit, by virtue of which:
the rims of the frame are positioned with respect to the eyes of the wearer so as, for example, to offer the wearer the widest possible field of view, while meeting the aesthetic criteria,
the spectacle frame rests on the nose of the wearer without sliding and without causing injury, with all the required stability,
the frame temples of the spectacle frame rest on the ears of the wearer, without excessive compression of the temples and without pulling too much on the ears,
the frame is horizontal on the head of the wearer, i.e. the axis O1X1 of the first frame of reference is parallel to the axis O2X2 of the second frame of reference, or the axis O2X2 of the second frame of reference is parallel to a line associated with the eyebrows or to the straight line passing through the two pupils of the wearer.

A satisfactory fit of the frame temples 14, 15 of the frame 10 is especially illustrated in FIGS. 5 and 6. FIG. 5 shows how the frame temple 15 of the frame follows the outline of the head TS of the wearer, without pressing against his head, and how the frame temple 15 rests in the trough S of his ear ORD.

FIG. 6 shows how the curvature of the frame temple 15, at the junction between the first portion of the frame temple 15 and the spatula 15A, must match the shape of the trough S of the ear ORD.

The fitting criteria allowing the fit to be determined may especially comprise, firstly, optimization criteria identical to those used above but this time used while taking into account the deformability of the frame:
maximization of the area of contact 16 between the pads 16A of the bridge 13 and the nose of the wearer,
maximization of the contact between the frame temples 14, 15 of the frame 10 and the trough S of the ears ORD, ORG of the wearer,
centralization of the eyes OD, OG with respect to the rims 11, 12 of the frame 10. Because possible deformation of the frame is envisioned, it is possible to take other criteria into account:
maintenance of the axis O1X1 parallel to the axis O2X2 in order to guarantee the horizontality of the frame 10,
minimization of zones of contact between the rims 11, 12 of the frame 10 and the cheekbones J and/or eyebrows SC of the wearer;

It is also possible to take into account target values for various fitting parameters characterizing the fit of the frame 10 on the head of the wearer:
target value for the spacing of the frame temples 14, 15 of the frame 10;

target value for the inclination of the frame temples 14, 15 of the frame 10 with respect to the rims of the frame 10;

target value for the separation between the pads 16A, target value for the separation between the eyes OD, OG and the rims 11, 12 of the frame 10, target value for the separation between the rims of the frame 10 and the eyebrows and/or cheekbones of the wearer, target value for the pantoscopic angle AMV (FIG. 3), target value for the face form of the frame.

The pantoscopic angle AMV is defined as the angle between the mean plane PMC of each rim of the frame 10 and the vertical eye plane PVO, which is the plane perpendicular to the gaze axis in the orthostatic position.

Preferably, the vertical eye plane PVO also corresponds to the plane perpendicular to the Frankfurt plane passing through the rotation centers CROG, CROD of the eyes, measured in projection in the sagittal plane of the head TS of the wearer.

These target values may be defined depending on standard fitting values: for example one target value for the distance between the eyes and the rims of the frame, i.e. the distance between the tops of the corneas of the eyes and the mean plane of each rim, is 12 millimeters.

It is also possible to set a target value for the separation between the rims of the frame 10 and the eyebrows and/or cheekbones of the wearer to 3 millimeters, for example.

It is lastly possible to set thus a target value equal to 6 degrees for the pantoscopic angle or equal to 8 degrees for the value of the face-form angle of the frame 10.

The target values may also be determined depending on the material of the frame: for example, for a satisfactory fit, it is possible to make provision for a target value for the separation between the frame temples to depend on the upper auricular separation, i.e. the separation between the troughs S of the right and left ears ORD, ORG.

For flexible frame temples, for example made of metal and of small thickness, the target value for the separation between the frame temples is equal to the upper auricular separation minus fifteen millimeters.

For semi-rigid frame temples, for example made of metal and of large thickness, the target value for the separation between the frame temples is equal to the upper auricular separation minus ten millimeters.

For rigid frame temples, for example made of plastic and of small thickness, the target value for the separation between the frame temples is equal to the upper auricular separation minus five millimeters.

For very rigid frame temples, for example made of plastic and of large thickness, the target value for the separation between the frame temples is equal to the upper auricular separation minus two or three millimeters.

The target values may be replaced by intervals of target values.

It is also possible to take into account other empirical criteria, for example to require that the frame temple 14, 15 make contact with the trough S of the ear ORG, ORD over a length comprised between 2 and 2.5 centimeters (FIG. 6) and that it be located at a distance comprised between 2 and 5 millimeters from the skull of the wearer. It is also possible to make provision for the shape of the spatula to be adapted all the way along the length of the trough of the ear. This adjustment allows the equipment to grip better, in particular for those having a quite flat nose, requiring a strong correction or engaging in a substantial amount of dynamic activity.

It is also possible to make provision to take into account specific desires of the wearer when determining the required deformation of the frame, with a view to achieving a fit that is satisfactory to this wearer.

To this end, it is possible to ask the wearer to fill in a questionnaire in order to determine whether he would for example like the spectacle frame to rest on a high-up portion of his nose, close to his eyes, in order to increase his field of view, or whether he would prefer the frame to rest lower down on his nose in proximity to its end. It is also possible to base the evaluation of the desires of the wearer on observation of the wearer with his old spectacle frame.

Next, his desires are converted into fitting criteria on the basis of the following fitting rules. As described below, the distance between the eyes of the wearer and the rims of the frame, and the pantoscopic angle of the latter, are in particular adjusted.

To adjust the positioning of the rims 11, 12 in front of the eyes OD, OG and/or to limit the zones of contact between the rims 11, 12 and the cheekbones J or the eyebrows SC of the wearer, it is possible to modify the separation between the pads 16A. Since the nose has a trapezoidal shape, the smaller the separation between the pads 16A, the more highly the frame 10 will be positioned on the face of the wearer.

It is also possible to adjust the arms 17 of the pads 16A to move the pads 16A further away or closer to the rims 11, 12 of the frame 10 and thus to modify the distance between the eyes OD, OG and the ophthalmic lenses that will be borne by the frame 10.

To ensure the horizontality of the frame and to adjust the pantoscopic angle, it is possible to modify the inclination of the frame temples 14, 15 with respect to the rims 11, 12 of the frame 10. This also makes it possible to alter the contact between each frame temple 14, 15 and the trough S of the corresponding ear ORD, ORG of the wearer.

To ensure the horizontality of the frame 10 on the head TS of the wearer with respect to the eyebrows or with respect to the eyes, it is necessary to incline downward the frame temple on the side of the lowest rim or to incline upward the frame temple on the side of the highest rim.

Depending on the height of the ears ORD, ORG with respect to the eyes, it is possible to incline the frame temples 14, 15 toward the bottom of the head of the wearer in order to increase the pantoscopic angle, thereby promoting the near vision of the wearer, or to incline the frame temples 14, 15 in order to decrease the pantoscopic angle, thereby especially allowing contact between the bottom of the rims of the frame and the cheekbones to be limited.

The openness of the frame temples 14, 15 is initially symmetric. However, if the front of the frame 10, which comprises the rims 11, 12 and the bridge 13, is not parallel to the face of the wearer, it is possible to adjust this parallelism by further opening the frame temple 14, 15 on that side of the front which is furthest from the face of the wearer.

When the frame temples do not include spatulas, the material of the frame must be quite rigid and the openness of the frame temples must be precisely determined in order to maintain the frame on the head without compressing the latter.

In order to determine the deformation of the frame 10 required to achieve the fit, it is possible firstly to identify the zones of incompatibility between the model of the frame 10 and the model of the head TS of the wearer. These zones of incompatibility for example correspond to those regions of space, in the second frame of reference O2X2Y2Z2 of the head TS of the wearer, in which the model of the frame 10 and the model of the head TS of the wearer interpenetrate. Once these zones of incompatibility have been identified, the deformation of the model of the frame 10 required to remove all these zones of incompatibility is determined by calculation. To this end, only a limited number of deformations of the frame, corresponding to the modifications that it is possible to make to this frame 10 during the adjustment, are permitted:

- modification of the angle of inclination of the frame temples of the frame with respect to the rims of the frame, i.e. in the plane O1X1Z1,
- modification of the angle of inclination of the spatulas 14A, 15A with respect to the first portion of the corresponding frame temple 14, 15,
- modification of the spacing of the ends of the two frame temples,
- modification of the face form of the frame.

For frames including pads 16A mounted on an arm 17 not integrated into the rims, it is also possible to modify the distance between the contact surfaces 16 of the pads and the rims 11, 12 of the frame 10, and the frontal angle and splay angle of each pad 16A.

The splay angle of each pad 16A corresponds to the inclination of the contact surface of the pad with respect to the plane O1Y1Z1 of the frame 10, measured in projection in the plane O1X1Z1.

The frontal angle of each pad 16A corresponds to the inclination of the contact surface of the pad with respect to the plane O1Y1Z1, measured in projection in the plane O1X1Y1.

It is possible to make provision for limiting deformation values not to be exceeded at the risk of damaging the frame, which may depend on the material of the frame.

Once the zones of incompatibility have been removed, it is possible to continue to optimize the placement of the frame 10 on the head of the wearer depending on the criteria described above, especially depending on the target value for the eye-lens distance, the target value for the pantoscopic angle, the face form of the frame, and the height of the frame with respect to the cheekbones and eyebrows of the wearer.

As explained above, the method is preferably at first implemented when the frame is chosen, before the ophthalmic lenses intended to be mounted in this frame have been produced.

The computational and electronic means may then be programmed to deduce, from the determined required deformation of the frame, a fitting difficulty level. This level of difficulty will be transmitted to the operator who may then advise the wearer to choose another frame if the adjustment required to obtain a fit turns out to be too difficult.

The experience of the operator and his ability to make the determined adjustment may also be taken into account.

An alarm may be raised if a satisfactory fit is impossible, for example if the adjustment required exceeds the mechanical limits of the frame and risks damaging it, or if the desirable modification of the frame is not possible. For example, with plastic frames it is not possible to modify the spacing of the pads, because such frames do not possess such pads.

Thus, advantageously, the computational and electronic means carry out, following step d), an additional step p) of returning information on the compatibility between the capacity of the frame to deform and the required deformation of the frame 10 determined in step d).

The computational and electronic means may also be programmed to determine, depending on the determined required deformation of the frame, a corrected model of the spectacle frame after this deformation, and in order to deduce therefrom parameters characterizing the comfortableness and visual performance of the pair of spectacles comprising this frame. These parameters may respectively be determined by taking into account the weight of the ophthalmic lenses and the placement of the eyes with respect to the rims of the spectacle frame.

Thus, advantageously, the computational and electronic means may carry out, following step d), after the frame has been adjusted and optionally readjusted, an additional step q) of returning information indicating an anticipated final relative position of the frame on the head of the wearer.

These various items of information are transmitted to the operator and may help in making the decision regarding the choice of spectacle frame.

When the final choice of frame has been made, the method then especially allows the frame to be adjusted to fit the face of the wearer in order to allow measurements of the wearer wearing the adjusted spectacle frame and that are required to manufacture the ophthalmic lenses to be taken. It is thus possible to measure the position of the pupils of the two eyes with respect to the rims of the frame and thus to correctly center the ophthalmic lenses with respect to the frame so that their center points are facing the pupils of the eyes. This may be done physically, with the frame 10 in its adjusted geometry, or numerically.

In the first case, in a step f) of the method, the deformation determined in step d) is applied to the spectacle frame 10. Next, the measurements of the wearer wearing the adjusted spectacle frame and that are required to manufacture the ophthalmic lenses are carried out. In a second case, in a step g), the corrected relative position of the model of a portion of the rims of the frame and of the model of a portion of the eyes of the wearer is determined, while taking into account the required deformation of the frame determined in step d), by means of a numerical simulation analogous to that of step c).

In a step h), depending on said corrected relative position determined in step g), at least one geometrico-physiognomic parameter of implantation of an ophthalmic lens in the frame is determined so that the optical center of the lens faces the corresponding eye of the wearer.

These geometrico-physiognomic parameters of implantation for example especially comprise the height H of the pupils with respect to the lowest point of the rims of the frame (FIG. 4), the pantoscopic angle AMV, the monocular pupillary distances and the position of the rotation centers of the eyes.

Optionally, in a step i), depending on said corrected relative position determined in step g), at least one optical refraction characteristic of at least one ophthalmic lens to be mounted in this frame 10 is determined.

The manufacture of the ophthalmic lenses is then more precise, and adapted both to the wearer and to the chosen frame.

Once the ophthalmic lenses have been manufactured and mounted in the spectacle frame, it is possible that the weight of the ophthalmic lenses will deform the spectacle frame and that the latter will no longer have exactly the same adjusted geometry as before the mounting of the ophthalmic lenses. It is then possible to reiterate the method according to the invention in order to determine the deformation of the frame required to adjust the frame equipped with ophthalmic lenses to fit the face of the wearer. Readjustment of the frame is then spoken of.

This readjustment may for example take into account a coefficient of elasticity of the skin of the nose and/or a parameter that varies as a function of the weight of the ophthalmic lenses.

Advantageously, since the model of the wearer is stored in memory in the computational and electronic means, this readjustment may be carried out in the absence of the wearer.

Whether for the adjustment or readjustment of the spectacle frame, the computational and electronic means are in addition preferably programmed to display instructions allowing the operator to apply step-by-step the deformation determined in step d) for the spectacle frame.

Above, an exemplary embodiment of the method was described in which, in steps a) and b) the models of the spectacle frame 10 and the head TS of the wearer were numerical models, and, in step c), the superposition of the two models was achieved by a numerical calculation.

According to a second embodiment of the adjusting process, in step b), the model of the head TS of the wearer is a physical model, and, in step c), a physical model of the frame 10 is superposed on this physical model of the head TS of the wearer by actually placing the physical model of the spectacle frame 10 on the physical model of the head of the wearer.

Thus, prior to step b), a step a) of determining a physical model of the spectacle frame is carried out. This has the advantage of allowing the deformation of the frame required to adjust this frame to fit on the head of the individual to be determined even without the real frame and without particular computational and electronic processing means allowing a numerical model to be generated and a superposition to be calculated.

This physical model of the frame may be produced by known prototyping techniques, for example by 3D printing after an acquisition of images of this frame.

In step d), from this superposition, the deformation of the frame 10 required to obtain a fit of the frame 10 on the head TS of the wearer meeting at least one predetermined fitting criterion is determined.

The fitting criteria taken into account here are the same as those described in the first embodiment.

It is especially a question of the following criteria:
maximization of the area of contact 16 between the pads 16A of the bridge 13 and the nose of the wearer,
maximization of the contact between the frame temples 14, 15 of the frame 10 and the trough S of the ears ORD, ORG of the wearer,
centralization of the eyes OD, OG with respect to the rims 11, 12 of the frame 10. Because possible deformation of the frame is envisioned, it is possible to take other criteria into account:
maintenance of the axis O1X1 of the first frame of reference of the frame parallel to the axis O2X2 of the second frame of reference of the head in order to guarantee the horizontality of the frame 10,
minimization of zones of contact between the rims 11, 12 of the frame 10 and the cheekbones J and/or eyebrows SC of the wearer.

These criteria may be evaluated by eye by the operator.

It may also be a question of achieving one or more target values, such as described in the first embodiment.

To this end, the operator may make distance or angle measurements on the superposition of the model of the frame and the model of the head of the wearer.

In any case, the operator thus evaluates the required deformation of the frame.

Next, this deformation may be applied to the real frame in order to make the adjustment.

According to a third embodiment of the adjusting method according to the invention, in step b), the model of the head TS of the wearer is a physical model, and, in step c), the frame 10 itself is superposed on this physical model of the head TS of the wearer by actually placing the spectacle frame 10 on the physical model of the head of the wearer.

In this case, no step of determining a model of the frame is carried out. The real spectacle frame is used directly and placed on the model of the head of the wearer.

This has the advantage of allowing the frame to be precisely adjusted, even in the absence of the wearer. This could for example allow the already adjusted frame to be dispatched to the wearer.

Preferably, in the second and third embodiments, in step b), the physical model of the head is produced to a scale of 1 using at least one of the following techniques:
rapid prototyping techniques,
a deformable bank that may optionally be motorized.

The model of the head of the wearer may comprise an artificial head with adjustable, for example motorized, model ears and nose that are controlled by the computational and electronic device.

As a variant, the physical model of the head is produced from a deformable carrier and an array of parts added to this carrier.

This artificial head may for example include a deformable carrier reproducing the shape and overall dimensions of the head, which receives models of the ears and nose that are produced by three-dimensional printing of data recorded by acquiring a three-dimensional image of the wearer.

As yet another variant, it is possible to envision, in step b), selecting the physical model of the head from a set of model heads produced beforehand.

This selection is for example performed on the basis of criteria characterizing the shapes of the face, nose and ears.

The fitting criteria taken into account here are the same as those described above.

These criteria may be evaluated by eye by the operator or using measuring instruments. In any case, the operator evaluates the required deformation of the frame.

This deformation may here be applied directly to the real frame in order to adjust the real frame to fit on the model of the head of the wearer.

Whatever the embodiment of the invention, provision may be made for a step of checking the adjustment made, in which step the centrality of the rims of the frame relative to the eyes of the wearer, the pantoscopic angle of the frame, the distance between the eyes and the rims of the frame, the face form of the frame, and the position of the frame temples on the ears are compared to standard or personalized target values for these parameters.

In the second and third embodiments, the physical model of the head of the wearer may be delivered, in order to allow this checking step to be carried out, simultaneously with the adjusted frame. For example, the model may be delivered to the optician in order to allow him to verify the adjustment made, or it may be delivered to the wearer himself in order to allow him to readjust a frame of his that has been deformed by use. This physical model facilitates the readjustment operations.

Whatever the embodiment in question, it is advantageously possible to carry out each of the steps in different locations. It is especially possible to carry out step b) at a first site and step d) at a second site.

The first site is located in any location that is accessible to the wearer, either physically or over the Internet: it is especially a question of the workplace of an optician, a kiosk installed in a mall, or even the Internet site of an optician. The second site is for example located at an opticians or in an optical laboratory.

The invention claimed is:

1. A method for adjusting a predetermined real spectacle frame (10) chosen by a given wearer for use by said wearer, comprising the steps of:
   a) determining an at least partial model of the head (TS) of the wearer, with, in a given frame of reference, at least one model (MN) of a portion of the nose (N), and one model (MORD, MORG) of a portion of the ears (ORD, ORG);
   b) simulating the positioning of the spectacle frame (10) on the head (TS) of the wearer, by superposing, on the model of the head (TS) of the wearer, the corresponding zones of said spectacle frame (10) or of a model thereof, a superposition being generated therefrom;
   c) determining, from said superposition, a deformation of the spectacle frame (10) required to obtain a fit of said spectacle frame (10) on the head (TS) of the wearer meeting at least one predetermined fitting criterion; and following said determining step c), applying the deformation determined in step c) to the spectacle frame (10).

2. The adjusting method as claimed in claim 1, wherein, in step a), the model of the head (TS) of the wearer is a numerical model, and, in step b), a numerical model of the spectacle frame (10) is superposed on said numerical model of the head (TS) of the wearer by a numerical calculation.

3. The adjusting method as claimed in claim 1, wherein, in step a), the model of the head (TS) of the wearer is a physical model, and, in step b), a physical model of the spectacle frame (10) is superposed on said physical model of the head (TS) of the wearer by placing the physical model of the spectacle frame (10) on the physical model of the head of the wearer.

4. The adjusting method as claimed in claim 1, further comprising the step of:
   prior to step b), carrying out a step d) of determining a model of the spectacle frame (10) with, in another given frame of reference, at least one model of a portion of the bridge (13) of the spectacle frame (10) and one model of a portion of the frame temples (14, 15) of the spectacle frame (10).

5. The adjusting method as claimed in claim 4, wherein, in step b), the following are superposed:
   the model of one portion of the bridge of the spectacle frame (10) and the model (MN) of one portion of the nose of the wearer; and
   the model of one portion of the frame temples of the spectacle frame (10) and the model (MORD, MORG) of one portion of the ears of the wearer.

6. The adjusting method as claimed in claim 4, wherein, in step d), a model of a portion of the rims (11, 12) of the spectacle frame (10) is determined, in step a), a model (MOD, MOG) of a portion of the eyes (OD, OG) of the wearer is determined and, in step c), said predetermined fitting criterion comprises a relative position of the rims (11, 12) of the spectacle frame (10) and of the eyes (OD, OG) of the wearer.

7. The adjusting method as claimed in claim 6, further comprising the step of:
   e) the corrected relative position of the model of a portion of the rims (11, 12) of the spectacle frame (10) and of the model of a portion of the eyes of the wearer is determined, while taking into account the required deformation of the spectacle frame (10) determined in step c), by means of a numerical simulation analogous to that of step b).

8. The adjusting method as claimed in claim 7, further comprising the step of:
   depending on said corrected relative position determined in step e), at least one geometrico-physiognomic parameter of implantation of an ophthalmic lens in the spectacle frame (10) is determined so that the optical center of the lens faces a corresponding eye (OD, OG) of the wearer.

9. The adjusting method as claimed in claim 7, further comprising the step of:
   depending on said corrected relative position determined in step e), at least one optical refraction characteristic of at least one ophthalmic lens to be mounted in said spectacle frame (10) is determined.

10. The adjusting method as claimed in claim 4, wherein, in step d), a model of a portion of the rims (11, 12) of the spectacle frame (10) is determined, in step a), a model of a portion of the cheekbones (J) and/or eyebrows (SC) of the wearer is determined and, in step c), said predetermined fitting criterion comprises a desired minimum distance between the rims (11, 12) of the spectacle frame (10) and the cheekbones and/or eyebrows of the wearer.

11. The adjusting method as claimed in claim 1, wherein, in step a), the model of the head (TS) of the wearer is a physical model, and, in step b), the spectacle frame (10) itself is superposed on said physical model of the head (TS) of the wearer by actually placing the spectacle frame (10) on the physical model of the head of the wearer.

12. The adjusting method as claimed in claim 11, wherein, in step a), the physical model of the head is produced to a scale of one, using at least one of the following techniques:
    rapid prototyping techniques, and
    a deformable bank.

13. The adjusting method as claimed in claim 11, wherein, in step a), the physical model of the head is produced from a deformable carrier and an array of parts added to said carrier.

14. The adjusting method as claimed in claim 11, wherein, in step a), the physical model of the head is selected from a set of model heads produced beforehand.

15. The adjusting method as claimed in claim 1, wherein, in step c), said predetermined fitting criteria comprises a desired relative position of the frame temples (14, 15) of the spectacle frame (10) with respect to the ears (ORD, ORG) of the wearer.

16. The adjusting method as claimed in claim 1, wherein, in step c), said predetermined fitting criteria comprises a desired spacing of the frame temples (14, 15) of the spectacle frame (10), depending on a determined separation between the ears (ORD, ORG).

17. The adjusting method as claimed in claim 1, wherein, in step c), said predetermined fitting criterion consists of an optimization of the area of contact between two pads (16A) of the bridge (13) of the spectacle frame (10) and the nose (N) of the wearer.

18. The adjusting method as claimed in claim 1, wherein step a) is carried out at a first site, and step c) is carried out at a second site.

19. The adjusting method as claimed in claim 18, wherein the first site is located in any place accessible to the wearer, either physically or over the Internet, and the second site is located at an optician or in an optical laboratory.

20. The adjusting method as claimed in claim 1, wherein, following step c), at least one of the two following additional steps is carried out:
  returning information on a compatibility between the deformability of the spectacle frame (10) and the required deformation of the spectacle frame (10) determined in step c); and
  after deformation of the spectacle frame (10) has been applied, returning information indicating an anticipated final relative position of the spectacle frame (10) on the head of the wearer.

* * * * *